(12) United States Patent
Lee et al.

(10) Patent No.: US 9,226,388 B2
(45) Date of Patent: Dec. 29, 2015

(54) PRINTED CIRCUIT BOARD

(71) Applicant: SAMSUNG ELECTRO-MECHANICS CO., LTD., Suwon (KR)

(72) Inventors: Sang-Kyung Lee, Suwon (KR); Hee-Kyoung Lee, Suwon (KR); Dong-Hwan Lee, Suwon (KR); Kyung-Sang Lim, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 3 days.

(21) Appl. No.: 13/955,474

(22) Filed: Jul. 31, 2013

(65) Prior Publication Data

US 2014/0034357 A1 Feb. 6, 2014

(30) Foreign Application Priority Data

Jul. 31, 2012 (KR) ........................ 10-2012-0084117

(51) Int. Cl.
*H05K 9/00* (2006.01)
*H05K 1/03* (2006.01)
*H05K 1/11* (2006.01)
*H05K 1/02* (2006.01)

(52) U.S. Cl.
CPC ............ *H05K 1/0242* (2013.01); *H05K 1/0219* (2013.01); *H05K 1/0233* (2013.01); *H05K 2201/086* (2013.01); *H05K 2201/0959* (2013.01); *H05K 2201/0979* (2013.01); *H05K 2201/09563* (2013.01); *H05K 2201/09609* (2013.01); *H05K 2201/09618* (2013.01)

(58) Field of Classification Search
CPC . H05K 1/0242; H05K 1/0219; H05K 1/0233; H05K 9/00; H05K 2201/09563; H05K 2201/09609; H05K 2201/0959
USPC ......... 174/255, 256, 262–266, 350, 388, 251; 333/246; 361/794, 800, 816, 818
See application file for complete search history.

(56) References Cited

U.S. PATENT DOCUMENTS

| | | | | |
|---|---|---|---|---|
| 5,315,069 A * | 5/1994 | Gebara | ............. | 174/250 |
| 5,428,506 A * | 6/1995 | Brown et al. | .................. | 361/794 |
| 5,981,869 A * | 11/1999 | Kroger | ............. | 174/388 |
| 6,608,535 B2 * | 8/2003 | Sherman et al. | ............... | 333/128 |
| 7,375,290 B1 * | 5/2008 | Kwark et al. | ................. | 174/262 |
| 2002/0121943 A1 * | 9/2002 | Axelrod et al. | ............... | 333/182 |
| 2006/0137907 A1 * | 6/2006 | Chheda et al. | ................ | 174/262 |
| 2008/0053689 A1 * | 3/2008 | Wu et al. | ....................... | 174/260 |
| 2008/0102565 A1 * | 5/2008 | Zeng et al. | .................... | 438/122 |
| 2008/0124521 A1 * | 5/2008 | Niino | ............................. | 428/138 |
| 2009/0029094 A1 * | 1/2009 | Sano et al. | ...................... | 428/74 |
| 2009/0243762 A1 * | 10/2009 | Chen et al. | .................... | 333/212 |

* cited by examiner

*Primary Examiner* — Sherman Ng
(74) *Attorney, Agent, or Firm* — NSIP Law

(57) ABSTRACT

A printed circuit board disclosed. One embodiment of the present invention provides a printed circuit board that includes: an insulation layer having multiple layers of circuit wirings formed therein; a via formed along a perimeter of the insulation layer and configured for connecting circuit wirings formed on different layers of the insulation layer, the via being formed in such a way that an inside thereof is hollow; and an electromagnetic wave absorbing part contained in the via.

6 Claims, 5 Drawing Sheets

PRINTED CIRCUIT BOARD

CROSS-REFERENCE TO RELATED APPLICATIONS

This application claims the benefit of Korean Patent Application No. 10-2012-0084117, filed with the Korean Intellectual Property Office on Jul. 31, 2012, the disclosure of which is incorporated herein by reference in its entirety.

BACKGROUND

1. Technical Field

The present invention relates to a printed circuit board that reduces electro-magnetic noise that is emitted to an outside.

2. Background Art

Generally, electronic devices, such as smart phones, tablet PCs and the like, are required to have higher operating frequencies, broadband, multiband, etc. in order to be more functional and smaller and transmit more data faster.

As the electronic devices have higher operating frequencies and become smaller, electromagnetic noise such as EMI (electromagnetic interference) can be generated between electronic devices or between internal modules or parts. The electromagnetic noise can cause the electronic devices to malfunction.

Korean Patent Publication 2010-0071435 (laid open on Jul. 3, 2012) disclosed an electromagnetic band-gap structure with an active element, a semiconductor chip having the same, and a method of manufacturing the same.

SUMMARY

An embodiment of the present invention provides a printed circuit board that can reduce electro-magnetic noise that is emitted to an outside.

An aspect of the present invention features a printed circuit board, which comprises: an insulation layer having multiple layers of circuit wirings formed therein; a via formed along a perimeter of the insulation layer and configured for connecting circuit wirings formed on different layers of the insulation layer, the via being formed in such a way that an inside thereof is hollow; and an electromagnetic wave absorbing part contained in the via.

The via can be arranged in a row along the perimeter of the insulation layer.

The via can be formed in groups of a plurality of vias and arranged along the perimeter of the insulation layer.

The electromagnetic wave absorbing part can be made of a metallic material different from that of the via.

The electromagnetic wave absorbing part can comprise a dielectric material and a metallic material.

The electromagnetic wave absorbing part can comprise a magnetic material.

DETAILED DESCRIPTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the ideas and scope of the present invention. Throughout the description of the present invention, when describing a certain relevant conventional technology is determined to evade the point of the present invention, the pertinent detailed description will be omitted.

Hereinafter, some embodiments of a printed circuit board according to the present invention will be described in detail with reference to accompanying drawings.

Figure 1:
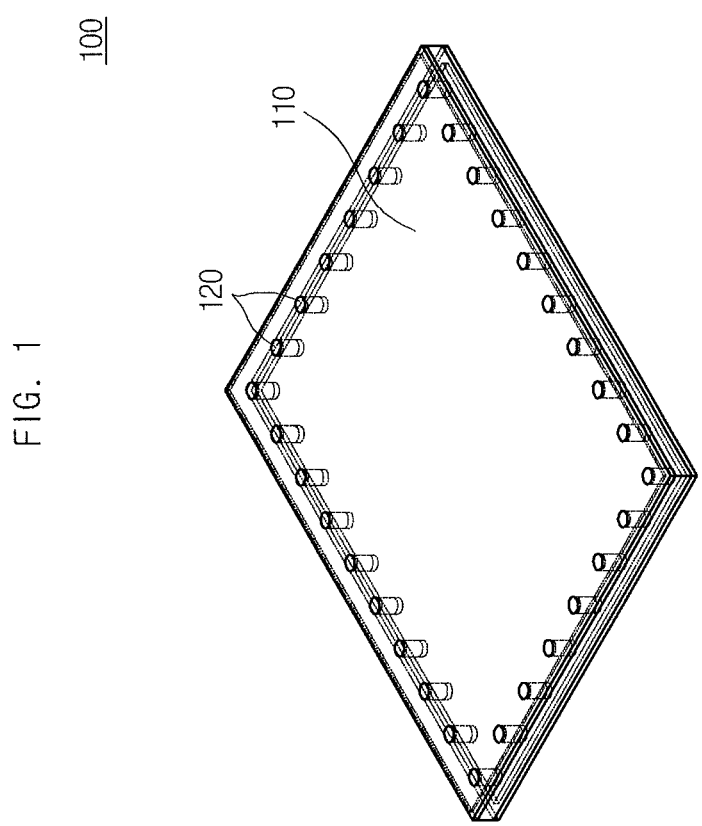
FIG. 1 depicts one embodiment of a printed circuit board according to the present invention.
Figure 2:
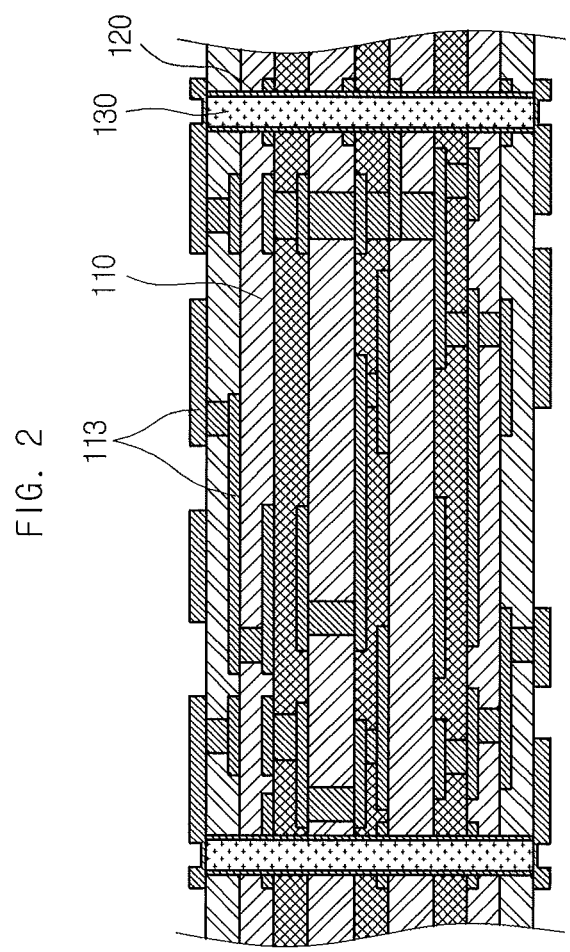
FIG. 2 depicts the printed circuit board shown in FIG. 1.
Figure 3:
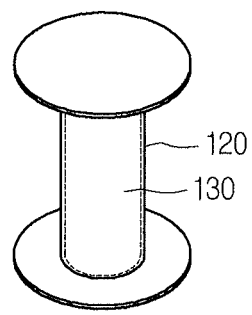
FIG. 3 depicts a via and an electromagnetic wave absorbing material shown in FIG. 1.

FIG. 1 depicts one embodiment of a printed circuit board according to the present invention, and FIG. 2 depicts the printed circuit board shown in FIG. 1, and FIG. 3 depicts a via and an electromagnetic wave absorbing material shown in FIG. 1.

Referring to FIGS. 1 through 3, a printed circuit board 100 can include an insulation layer 110, a via 120 and an electromagnetic wave absorbing part 130.

The insulation layer 110 can have multiple layers of circuit wirings formed therein, and circuit wirings on the plurality of layers may be formed on the insulation layer 110. The circuit wirings 113 can include a plurality of inner layer circuit wirings 113 formed inside the insulation layer 110 and outer layer circuit wirings 113 formed on either surface of the insulation layer 110. The insulation layer 110 can be made of various kind of non-conductive materials.

The via 120 can be formed along a perimeter of the insulation layer 110. For example, the via 120 can be arranged in a row along the perimeter of the insulation layer 110. The via 120 can be equally spaced along the perimeter of the insulation layer 110. Since the via 120 is arranged in a row along the perimeter of the insulation layer 110, the electromagnetic wave absorbing part 130 placed inside the via 120 can prevent electromagnetic noise from being emitted to an outside through the perimeter of the insulation layer 110.

The via 120 can penetrate the insulation layer 110 to connect the circuit wirings 113 that are on different layers. Here, the via 120 can connect the circuit wiring 113 of every layer or the circuit wirings of some layers.

The via 120 can be formed in such a way that an inside thereof is hollow. The inside of the via 120 can be formed to be hollow by forming a via hole in the insulation layer 110 and then forming a plating layer on an inner wall of the via hole. The via 120 can be formed by plating the inner wall of the via hole. The via 120 can be formed when the outer layer circuit wirings 113 are formed or independently from the outer layer circuit wirings 113. The via 120 can be formed in a cylindrical shape, of which an inside is hollow.

The via 120 can be connected with a ground wiring, among the outer layer circuit wirings 113. The ground wiring can be separated from the circuit wirings 113 that transfer electrical signals.

The electromagnetic wave absorbing part 130 can be contained inside the via 120. Since the electromagnetic wave absorbing part 130 is contained inside the via 120, it becomes possible to prevent electromagnetic noise from being emitted to an outside through an internal space of the via 120. Accordingly, it is possible to reduce the emission of electromagnetic noise to the outside dramatically. Also, since the electromagnetic wave absorbing part 130 is arranged along the perimeter of the insulation layer 110, it is also possible to prevent the electromagnetic noise from being emitted through a perimeter of the printed circuit board.

The electromagnetic wave absorbing part 130 can be made of metallic materials that are different from the via 120. For example, the via 120 can be made of a copper-plated material, and the electromagnetic wave absorbing part 130 can be made of ferrite. Here, the electromagnetic wave absorbing part 130 can be ferrite consisting of one or more of Mn—Zn group, Mn—Mg group, Ni—Zn group, Ba and Sr.

The electromagnetic wave absorbing part 130 can include a dielectric material and the aforementioned metallic material. The electromagnetic wave absorbing part 130 can be formed by mixing a powder form of the dielectric material with a powder form of the metallic material. After filling the inside of the via 120 with the powder form of the electromagnetic wave absorbing part 130, either end of the via 120 can be sealed with, for example, a cover.

The electromagnetic wave absorbing part 130 can have a magnetic material. As a magnetic material is used as the electromagnetic wave absorbing part 130, the electromagnetic noise can be absorbed more effectively. The electromagnetic wave absorbing part 130 can be constituted entirely or partially with the magnetic material.

The insulation layer 110 can further have a metallic shield plate on a top surface and a bottom surface thereof. The shield plate can prevent the electromagnetic noise from being emitted in directions of the top surface and the bottom surface.

Since the printed circuit board described hitherto has the via 120 with the electromagnetic wave absorbing part 130 arranged along the perimeter of the insulation layer 110, the electromagnetic noise that propagates in the direction of a plane of the insulation layer 110 can be absorbed by the electromagnetic wave absorbing part 130. Therefore, the amount of emission of electromagnetic noise from the printed circuit board can be reduced.

Figure 4:
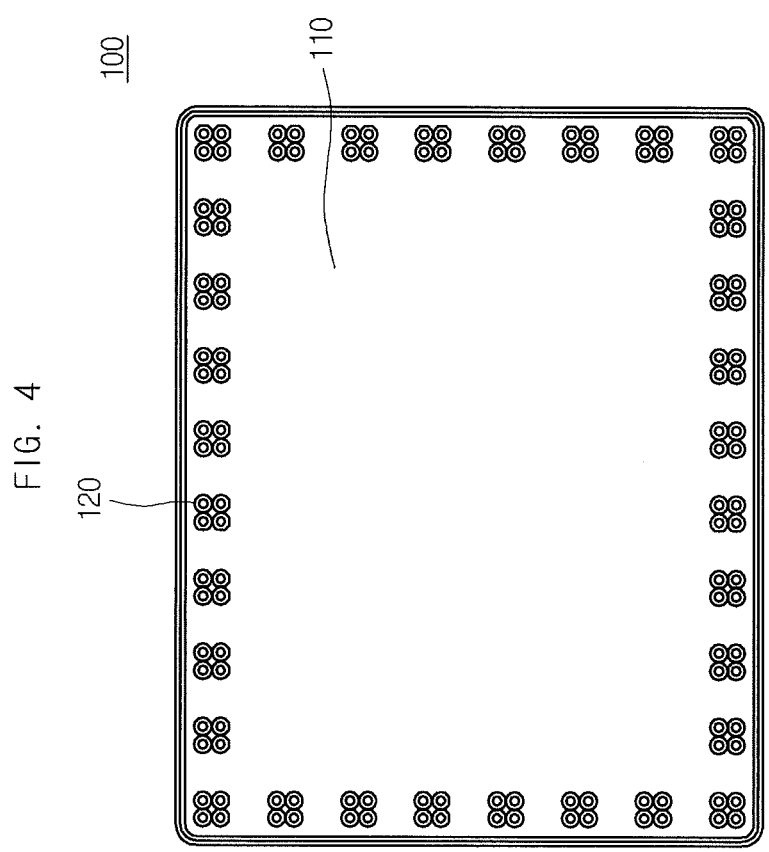
FIG. 4 depicts another embodiment of the printed circuit board according to the present invention.
Figure 5:
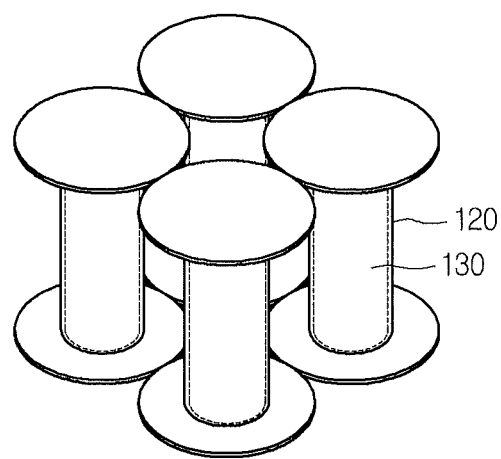
FIG. 5 depicts a via shown in FIG. 4.

FIG. 4 depicts another embodiment of the printed circuit board according to the present invention, and FIG. 5 depicts a via.

Referring to FIGS. 4 and 5, a printed circuit board 100 can include an insulation layer 110, a via 120 and an electromagnetic wave absorbing part 130.

The insulation layer 110 can have multiple layers of circuit wirings. Circuit wiring 113 can include a plurality of inner layer circuit wirings 113 formed inside the insulation layer 110 and outer layer circuit wirings 133 formed on either surface of the insulation layer 110. The insulation layer 110 can be made of various kinds of non-conductive materials.

The via 120 can be formed along a perimeter of the insulation layer 110. For example, groups of a plurality of the vias 120 can be arranged along the perimeter of the insulation layer 110. Here, the groups of the vias 120 can be equally spaced along the perimeter of the insulation layer 110. Since the groups of the vias 120 are arranged along the perimeter of the insulation layer 110, the electromagnetic wave absorbing part 130 placed inside the via 120 can prevent electromagnetic noise from being emitted to an outside through the perimeter of the insulation layer 110.

The via 120 can penetrate the insulation layer 110 to connect the circuit wirings 113 that are on different layers. Here, the via 120 can connect the circuit wirings 113 of every layer or the circuit wirings 113 of some layers.

The via 120 can be formed in such a way that an inside thereof is hollow. The inside of the via 120 can be formed to be hollow by forming a via hole in the insulation layer 110 and then forming a plating layer on an inner wall of the via hole. The via 120 can be formed by plating the inner wall of the via hole. The via 120 can be formed when the outer layer circuit wirings 113 are formed or independently from the outer layer circuit wirings 113. The via 120 can be formed in a cylindrical shape, of which an inside is hollow.

The via 120 can be connected with a ground wiring, among the outer layer circuit wirings 113. The ground wiring can be separated from the circuit wirings 113 that transfer electrical signals.

The electromagnetic wave absorbing part 130 can be contained inside the via 120. Since the electromagnetic wave absorbing part 130 is contained inside the via 120, it becomes possible to prevent electromagnetic noise from being emitted to an outside through an internal space of the via 120. Accordingly, it is possible to reduce the emission of electromagnetic noise to the outside dramatically. Also, since the electromagnetic wave absorbing part 130 is arranged along the perimeter of the insulation layer 110, it is also possible to prevent the electromagnetic noise from being emitted through a perimeter of the printed circuit board.

The electromagnetic wave absorbing part 130 can be made of metallic materials that are different from the via 120. For example, the via 120 can be made of a copper-plated material, and the electromagnetic wave absorbing part 130 can be made of ferrite. Here, the electromagnetic wave absorbing part 130 can be ferrite consisting of one or more of Mn—Zn group, Mn—Mg group, Ni—Zn group, Ba and Sr.

The electromagnetic wave absorbing part 130 can include a dielectric material and the aforementioned metallic material. The electromagnetic wave absorbing part 130 can be formed by mixing a powder form of the dielectric material with a powder form of the metallic material. After filling the inside of the via 120 with the powder form of the electromagnetic wave absorbing part 130, either end of the via 120 can be sealed with, for example, a cover.

The electromagnetic wave absorbing part 130 can have a magnetic material. As a magnetic material is used as the electromagnetic wave absorbing part 130, the electromagnetic noise can be absorbed more effectively. The electromagnetic wave absorbing part 130 can be constituted entirely or partially with the magnetic material.

The insulation layer 110 can further have a metallic shield plate on a top surface and a bottom surface thereof. The shield plate can prevent the electromagnetic noise from being emitted in directions of the top surface and the bottom surface.

Since the printed circuit board described hitherto has the groups of the vias 120 with the electromagnetic wave absorbing part 130 arranged along the perimeter of the insulation layer 110, the electromagnetic noise that propagates in the direction of a plane of the insulation layer 110 can be absorbed by the electromagnetic wave absorbing part 130. Therefore, an amount of emission of electromagnetic noise from the printed circuit board can be reduced. In addition, since the groups of the vias 120 form multiple rows of electromagnetic noise shielding structure along the perimeter of the insulation layer 110, the electromagnetic noise can be shielded much more effectively.

Although certain embodiments of the present invention have been described, the embodiments are for illustrative purposes only, and the present invention shall not be restricted to the described embodiments. It is to be appreciated that those skilled in the art can implement other embodiment(s) by supplementing, modifying, deleting and/or adding any elements without departing from the technical ideas of the invention.

What is claimed is:

1. A printed circuit board, comprising: an insulation layer having multiple layers of circuit wirings formed therein; a via made of a metallic material, formed along a perimeter of the insulation layer and configured for connecting circuit wirings formed on different layers of the insulation layer, the via being formed in a cylindrical shape and having a hollow inside; and an electromagnetic wave absorbing part contained in the hollow inside of the via, wherein the electromagnetic wave absorbing part is in direct contact with the metallic via material.

2. The printed circuit board of claim 1, wherein the via is arranged in a row along the perimeter of the insulation layer.

3. The printed circuit board of claim 1, wherein the via is formed in groups of a plurality of vias and arranged along the perimeter of the insulation layer.

4. The printed circuit board of claim 1, wherein the electromagnetic wave absorbing part is made of a metallic material different from that of the via.

5. The printed circuit board of claim 4, wherein the electromagnetic wave absorbing part comprises a dielectric material and a metallic material.

6. The printed circuit board of claim 4, wherein the electromagnetic wave absorbing part comprises a magnetic material.

* * * * *